US012793934B2

(12) United States Patent
Bassom

(10) Patent No.: US 12,793,934 B2
(45) Date of Patent: Nov. 10, 2026

(54) ION BEAM PROFILING USING OPTICAL TOMOGRAPHY

(71) Applicant: Axcelis Technologies, Inc., Beverly, MA (US)

(72) Inventor: Neil J. Bassom, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 141 days.

(21) Appl. No.: 18/818,760

(22) Filed: Aug. 29, 2024

(65) Prior Publication Data

US 2025/0087448 A1 Mar. 13, 2025

Related U.S. Application Data

(60) Provisional application No. 63/581,283, filed on Sep. 8, 2023.

(51) Int. Cl.

| | |
|---|---|
| ***H01J 37/00*** | (2006.01) |
| ***H01J 37/24*** | (2006.01) |
| ***H01J 37/244*** | (2006.01) |
| *H01J 37/317* | (2006.01) |

(52) U.S. Cl.

CPC ............ *H01J 37/244* (2013.01); *H01J 37/24* (2013.01); *H01J 37/3171* (2013.01); *H01J 2237/24578* (2013.01)

(58) Field of Classification Search

CPC .............................................. H01J 2237/24542

See application file for complete search history.

(56) References Cited

U.S. PATENT DOCUMENTS

| | | | | |
|---|---|---|---|---|
| 7,723,697 | B2 | 5/2010 | Perel et al. | |
| 11,830,703 | B2 | 11/2023 | Kawasaki et al. | |
| 2008/0061250 | A1 | 3/2008 | Perel et al. | |
| 2009/0078883 | A1 * | 3/2009 | Perel ..................... | H01J 37/244 250/396 R |
| 2024/0136170 | A1 | 4/2024 | Hirao et al. | |

FOREIGN PATENT DOCUMENTS

| | | | |
|---|---|---|---|
| TW | 202006802 | A | 2/2020 |
| TW | 202234462 | A | 9/2022 |

OTHER PUBLICATIONS

Nikon, Industrial X-ray and CT, Advanced Industrial X-ray and CT.

* cited by examiner

*Primary Examiner* — Dani Fox

(74) *Attorney, Agent, or Firm* — Eschweiler & Potashnik, LLC

(57) ABSTRACT

An ion beam characterization system has one or more sensors positioned with respect to an ion beam. The one or more sensors image a portion of the ion beam over a predetermined range of angles and positions of the one or more sensors with respect to the portion of the ion beam, and define imaging data associated with the portion of the ion beam. A controller is configured to define a two-dimensional profile of the portion of the ion beam based, at least in part, on the imaging data. The two-dimensional profile is based, at least in part, on the predetermined range of angles and positions of the one or more sensors with respect to the ion beam and light associated with the ion beam. The sensors receive the light associated with the ion beam and to provide a signal to the controller based on the received light.

20 Claims, 3 Drawing Sheets

ION BEAM PROFILING USING OPTICAL TOMOGRAPHY

REFERENCE TO RELATED APPLICATIONS

This application claims the benefit of U.S. Provisional Application Ser. No. 63/581,283 filed Sep. 8, 2023, entitled, “OPTICAL BEAM TOMOGRAPHY”, the contents of all of which are herein incorporated by reference in their entirety.

TECHNICAL FIELD

The present invention relates generally to ion implantation systems, and more specifically to system and method for characterizing and controlling an ion beam.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an “n-type” extrinsic material wafer, whereas a “p-type” extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

SUMMARY

The present disclosure thus provides systems and apparatuses for characterizing and controlling an ion beam in an ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one example aspect of the disclosure, an ion beam characterization system is provided, wherein the ion beam characterization system comprises one or more sensors positioned with respect to an ion beam, wherein the one or more sensors are configured to image a portion of the ion beam. The one or more sensors, for example, are configured to image a portion of the ion beam over a predetermined range of angles and positions of the one or more sensors with respect to the portion of the ion beam, thereby defining imaging data associated with the portion of the ion beam.

The ion beam characterization system further comprises a controller configured to define a two-dimensional profile of the portion of the ion beam. The controller, for example, is configured to define the two-dimensional profile of the portion of the ion beam based, at least in part, on the imaging data. The controller, for example, is further configured to compute the two-dimensional profile of the portion of the ion beam based, at least in part, on a position and/or angle of the one or more sensors with respect to the ion beam and light associated with the ion beam.

The one or more sensors, for example, are configured to receive the light associated with the ion beam and to provide a signal to the controller based on the light that is received by the one or more sensors. The ion beam characterization system, for example, can comprise a transformation motion apparatus associated with the one or more sensors, wherein the transformation motion apparatus is configured to selectively control the light received by the one or more sensors.

In one example, the transformation motion apparatus is operably coupled to the one or more sensors and configured to selectively move the one or more sensors in one or more directions with respect to the ion beam. The transformation motion apparatus, for example, can comprise a translation apparatus configured to selectively translate and/or rotate the one or more sensors with respect to the ion beam.

The ion beam characterization system, for example, can further comprise an aperture apparatus selectively positioned between the one or more sensors and the ion beam, wherein the aperture apparatus comprises one or more apertures configured to control an amount of the light received by the one or more sensors.

In one example, the transformation motion apparatus is configured to selectively move the aperture apparatus in one or more directions with respect to the ion beam, and wherein the controller is further configured to compute the two-dimensional profile of the portion of the ion beam based, at least in part, on a position of the one or more apertures with respect to the ion beam.

In another example, the transformation motion apparatus comprises a translation apparatus configured to selectively translate and/or rotate the aperture apparatus with respect to the ion beam. The one or more apertures, for example, can consist of a plurality of apertures positioned at a respective plurality of angles with respect to the ion beam.

In yet another example, the ion beam characterization system further comprises a gas source configured to supply a gas to a region associated with the portion of the ion beam. The gas can be provided at a predetermined flow rate. For example, the ion beam is configured to form a plasma with the gas, wherein the light associated with the ion beam is associated with light emitted from the plasma.

The controller and the one or more sensors of the ion beam characterization system for example, generally define a tomographic system. The two-dimensional profile, for example, can be defined by a matrix of pixels. In one example, the matrix of pixels is associated with the portion of the ion beam.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
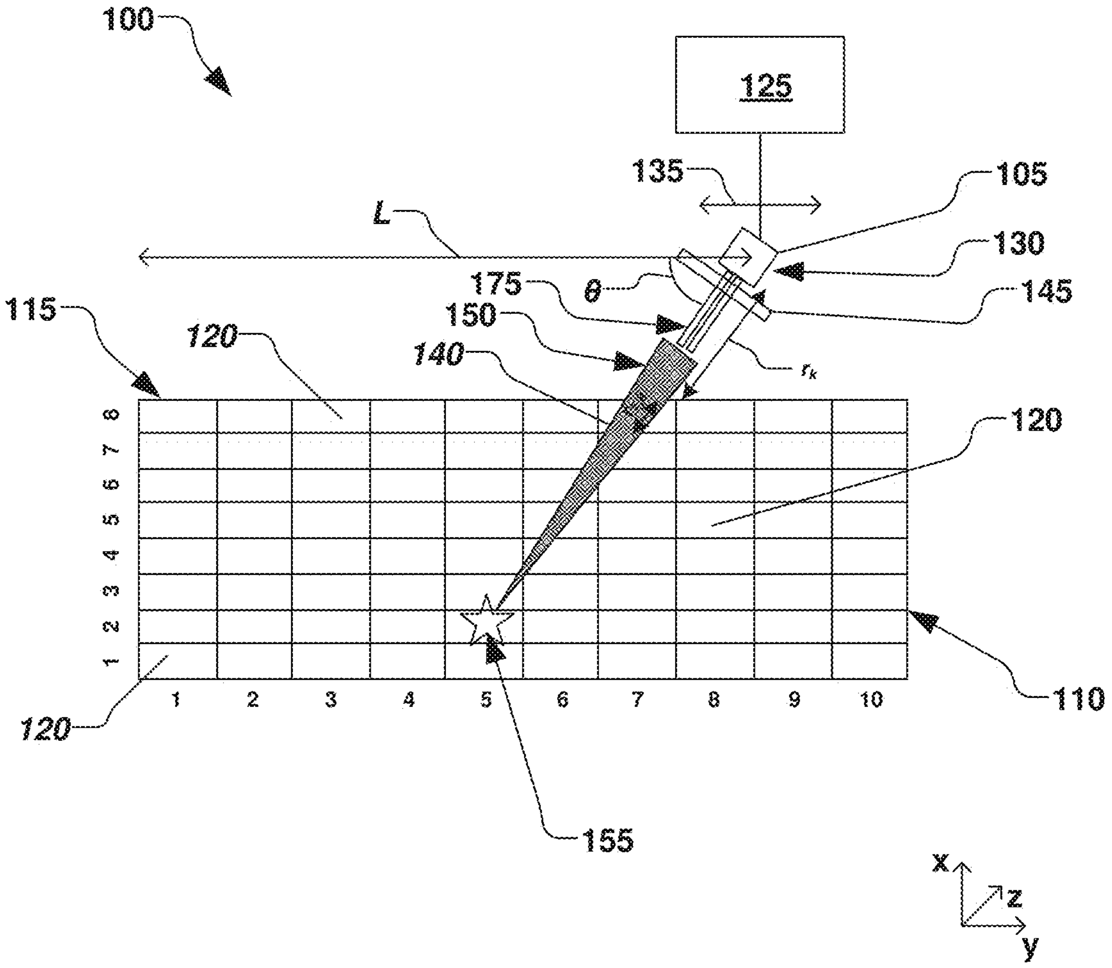
FIG. 1 is a schematic representation of an ion beam characterization system in accordance with several example aspects of the present disclosure.

The present disclosure is directed generally toward a system, apparatus, and method for characterizing and controlling ion density of an ion beam in an ion implantation system. In particular, the disclosure provides a non-invasive measurement system and method for measurement of a two-dimensional beam current density of an ion beam via a plurality of measurements using one or more collimated sensors. The system and method therefore provides a determination or calculation of a two-dimensional intensity of an ion beam.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

The present disclosure provides a non-invasive measurement of two-dimensional beam current density of an ion beam by taking a multiplicity of measurements using a collimated sensor, whereby a two-dimensional intensity of an ion beam can be calculated.

For example, the disclosure contemplates a measurement of a width of the ion beam via a camera mounted or otherwise positioned above the ion beam. The camera, for example, can be aimed directly at the ion beam through a window or by a mirror positioned at a predetermined angle (e.g., 45 degrees) to both camera and ion beam. The camera, for example, can be arranged and configured to collect light emitted through a depth of the ion beam.

The present disclosure appreciates that optical emission intensity of the ion beam may not accurately correspond to an ion density of the ion beam, but can provide a pathway for characterizing the width of the ion beam. For example, the optical emission intensity can be utilized as a feedback mechanism for tuning of the ion beam. In contrast to a profiler being inserted into the beamline, optical emission imaging of the ion beam is contemplated as being an attractive metrology approach, as the optical emission imaging does not affect or interfere with the ion beam.

It is appreciated that imaging with a camera from above the ion beam may have limitations. For example, an intensity recorded at an (x, z) position (where the z-axis is oriented along a direction of travel of the ion beam and the x-axis is horizontal or perpendicular to the direction of travel of the ion beam), is an integrated signal over all emitting volumes over the y-axis at the given (x, z) position, whereby variations in the vertical intensity of the ion beam along the y-axis may not be captured. The present disclosure appreciates that it would be advantageous to characterize variations of the ion density in the y-axis to identify so-called "hot spots" and "hollow regions" in the ion beam and to control or otherwise manipulate beamline parameters in order to control or eliminate such variations in real-time or near-real time.

In one example of the present disclosure, one or multiple collimated sensors are provided, whereby the position and angle relative to the beam is selectively varied to generate a dataset from which the intensity variation in the y-axis can be determined, modeled, or constructed. Unlike some approaches used in Computer Assisted Tomography (CAT) scanner systems for medical and failure analysis imaging where a source of illumination is implemented, the present disclosure contemplates a configuration and analysis scheme where a signal is generated, not absorbed, in a region of interest, whereby a source of illumination is not needed.

In accordance with one example, one principle of the present disclosure is illustrated in FIG. 1, whereby an ion beam characterization system 100 comprises one or more sensors 105 (e.g., a collimated sensor, also called a detector) positioned at a predetermined (e.g., fixed) position L and angle θ with respect to an ion beam 110. For example, a region of interest 115 of the ion beam 110 is divided into a plurality of pixels 120 (e.g., illustrated as an 8×10 array of pixels, however various configurations and number of pixels are contemplated), whereby the predetermined position L and angle θ of the sensor 105 is known with respect to the region of interest. A transformation motion apparatus 125 (e.g., a stepper system) may be provided to translate and/or rotate the sensor 105 to collect a number n of angles $\theta_n$ at a respective number n of profiler positions 130 of the sensor along a profiler path 135. As such, the plurality of pixels 120 can be mapped, as well as a distance passed for each pixel for the light generated to reach the one or more sensors 105 for the each of the respective plurality of pixels.

A total distance $R_n$ between the center of a ray 140 of the $n^{th}$ originating pixel 120 and the $k^{th}$ position L of the sensor 105 is given by $$R_n = r_k + \sum\nolimits_p r_{i,j}, \quad (1)$$

The summation in equation (1), for example, is understood to be over all the plurality of pixels 120 that the ray 140 traverses, whereby $r_k$ is the distance between the last pixel 120 and the sensor 105, including a thickness of a window 145 through which the ray 140 passes. While not shown, an offset may be further considered in equation (1), whereby the offset can be a result of refraction through the window 145. For example, the offset can account for the angle at which the ray 140 from the ion beam 110 traverses the window 145, as well as properties of the window, such as a thickness and a refractive index of the window. For example, a coating (not shown) on the window 145 can cause a loss in signal that is dependent on the position at which the ray 140 from the ion beam 110 enters the window.

Thus, the total light collected by the sensor 105 at any profiler position 130 is determined by a sum of the contributions from all pixels 120 along the projected path 150 of the ray 140 from an originating pixel 155 to the sensor 105, less any light scattered between the pixel and the sensor and/or any losses at the window 145. The contribution from each pixel 120, for example, is discounted by the square of its distance from the sensor 105. The overall intensity, for example, is reduced by a factor proportional to the square of the distance between pixel 120 and sensor 105. Scattering of the light, for example, can be further accounted for by a term that depends on the ion density in the pixels between the originating pixel 155 and sensor 105.

As such, the light collected at a sensor position and/or angle can be defined as:

$$\text{Light} = (1 - \mathit{WindowLoss})\sum\nolimits_{\textit{pixels along line from sensor}} \frac{\text{Density in pixel}/(\text{pixel to sensor distance})^2}{\sum\nolimits_{\textit{Intervening pixels}} \text{Density in intervening pixel}}, \quad (2)$$

where WindowLoss is the fraction of light loss due to the window 145. Regardless of refinements that may also be included, such as for various inverse square terms attributed to the light reaching a scattering pixel decreasing with the square of the distance between that pixel and the originating pixel, and an understanding that a portion of the light scattered at intervening pixels will nevertheless reach the sensor 105, a set of equations can be provided for measurements performed at a plurality positions L and angles θ of the sensor. The set of equations, for example, can comprise one or more of a set of intensities equal in number of the number of pixels 120 being measured, a set of loss terms equal in number to the number of pixels measured in the x-direction, and known coefficients derived from geometrical concerns.

In one example, a plurality of measurements are performed, thereby generating a plurality of equations to overdetermine the problem. As such, best estimate calculations can be performed, and can include an accounting for noise levels in measurements, timing of measurements (e.g., how recently measurements were taken), or other considerations. Computations to generate a best set of intensity and loss terms can be dependent on the number of pixels 120 that are measured, thus optimizing or minimizing computational requirements based on the size (in pixels) of the region of interest 115.

Figure 2:
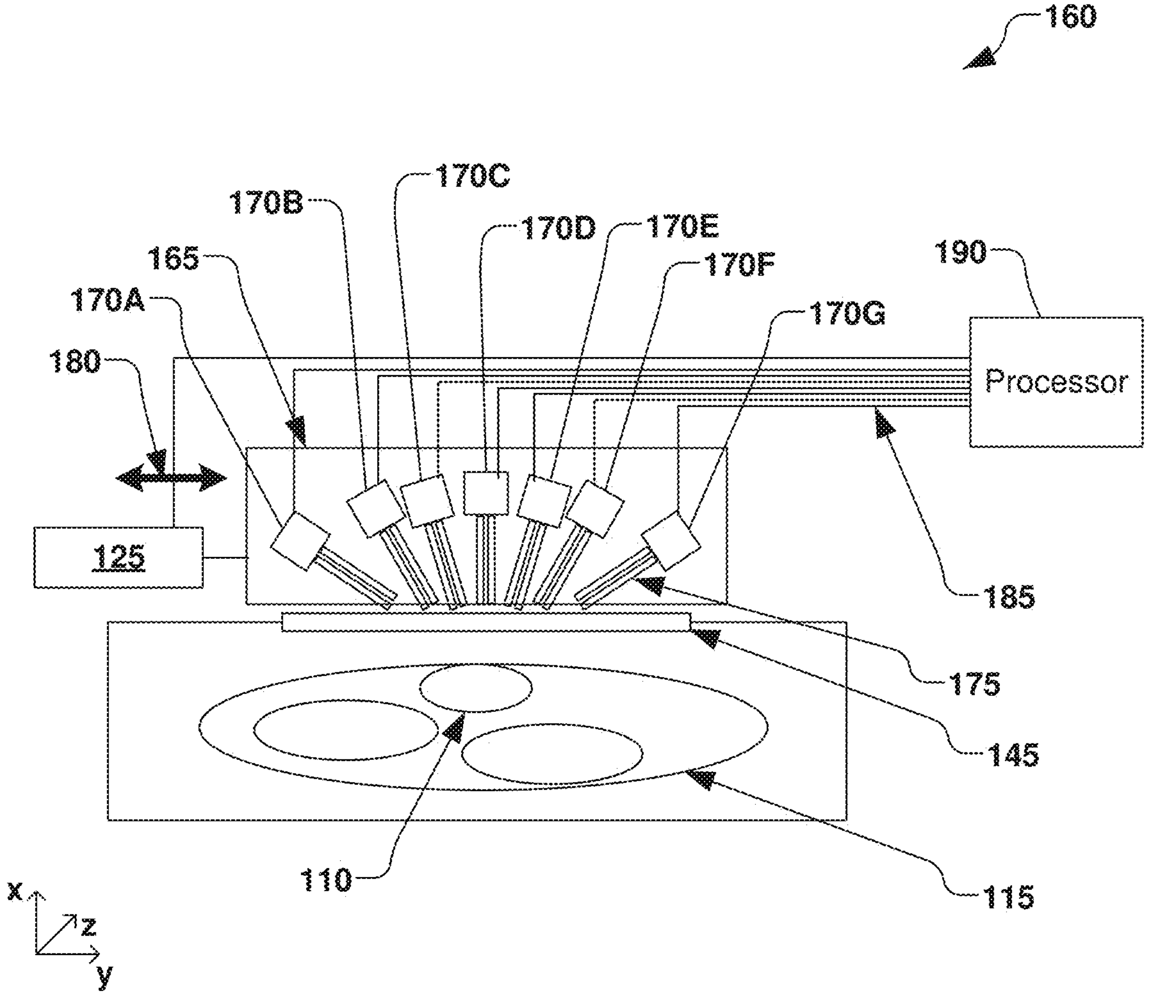
FIG. 2 is a schematic representation of an ion beam characterization system having a plurality of sensors in accordance with several example aspects of the present disclosure.

In accordance with another example of the present disclosure, a plurality of sensors 105 can be provided to advantageously increase a speed of data collection. As illustrated in FIG. 2, for example, an ion beam characterization system 160 is provided comprising a sensor array 165, wherein the sensor array comprises a plurality of sensors 170A-170G. Each of the plurality of sensors 170A-170G can be configured in a manner similar to the sensor 105 shown in FIG. 1. It is noted that while the sensor array 165 can comprise any number of sensors 105, and is not to be limited by the number of sensors described or illustrated.

The present disclosure further appreciates various configurations of the ion beam characterization systems 100, 160 of FIGS. 1-2 are contemplated to achieve increased speed and/or accuracy of characterization of the region of interest 115 of the ion beam 110. For example, the sensors 105, 170A-170G (e.g., including associated collimators) of FIGS. 1-2 can be configured as slot-shaped structures 175 along the z-axis in order to optimize a signal-to-noise ratio. Further, various configurations can optimize a speed of acquisition, whereby the output of the measurement can be an average value of the emission along a predetermined sample length.

In other examples, the present disclosure contemplates providing a plurality of sensors 170A-170G on a single head (not shown), whereby the single head is configured to be translated and/or rotated concurrently or simultaneously along a travel path of the plurality of sensors via the transformation motion apparatus 125. The plurality of sensors 170A-170G, for example, can be fixed in an array, whereby the array is configured to translate or scan (illustrated by arrow 180 in FIG. 2) in the y-direction. In another example, the plurality of sensors 170A-170G can be provided in a fixed array and configured proximate to a rotating disk apparatus (not shown). The rotating disk apparatus, for example, can comprise a disk having a plurality of slots provided therethrough, whereby the plurality of slots are defined at various angles. The disk can be further positioned proximate to the plurality of sensors 170A-170G, whereby a rotation apparatus is configured to rotate the disk through a sensing path (e.g., the projected path 150 of FIG. 1) associated with the plurality of sensors. Accordingly, motion of the rotation apparatus is limited to the rotation of the disk with respect to the plurality of sensors 170A-170G.

The present disclosure further contemplates other variations as falling within the scope of the disclosure, such as a calculation associated with a relatively small number of pixels 120, and increasing the number of pixels as signals 185 are provided to a controller 190 (e.g., a computer processor), thereby providing better estimates of the signal-to-noise ratio, etc. In another example, in order to appreciate an effect of various changes in the ion beam characterization systems 100, 160 of FIGS. 1-2, a dataset of predetermined size can be collected in order to calculate initial intensity estimates, whereby the data is refreshed on a first in, first out manner. As such, the oldest data in the dataset is replaced with the newest data, and the estimated intensities are recalculated as additional data becomes available.

Figure 3:
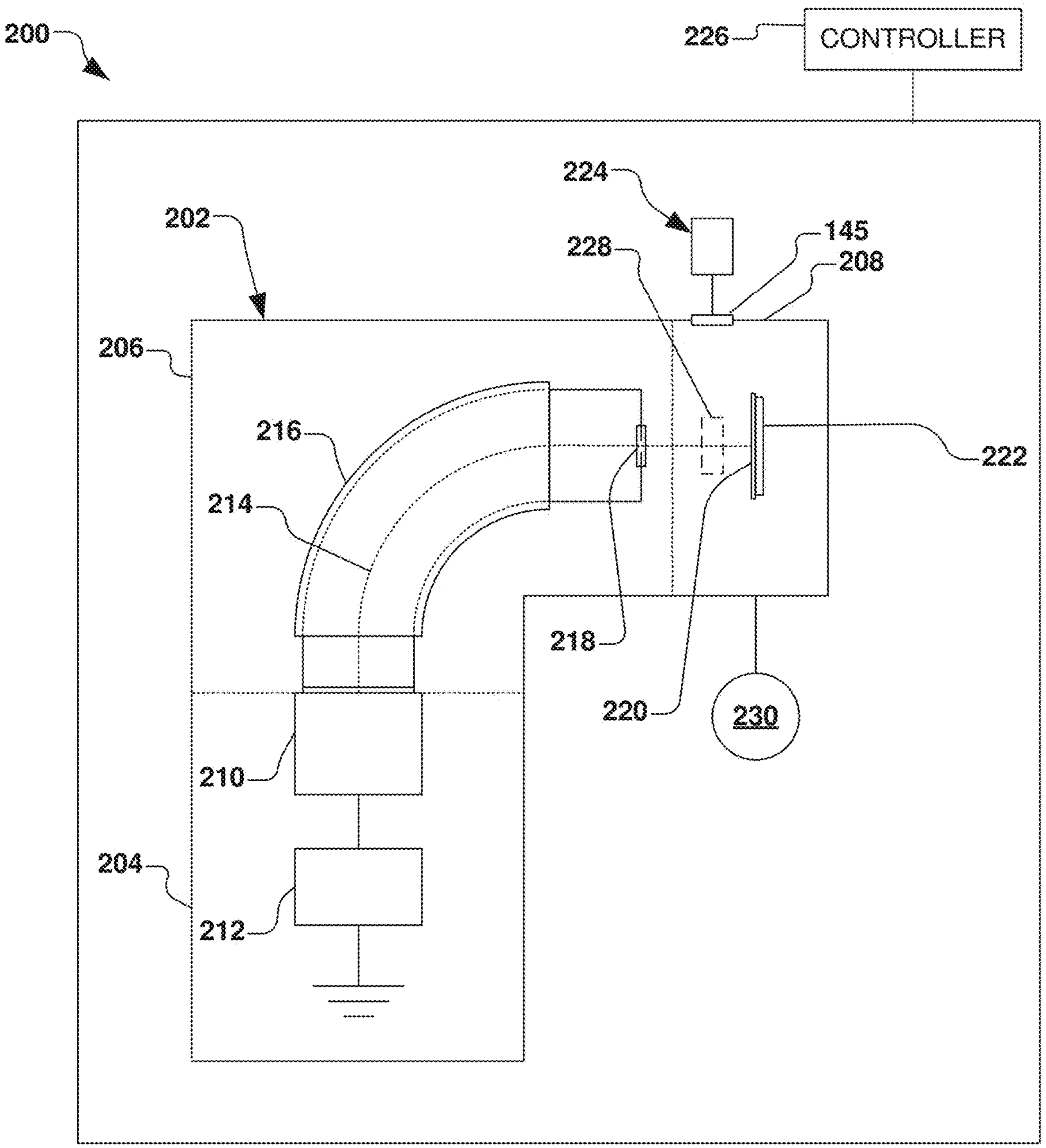
FIG. 3 is a block diagram of a vacuum system having an ion beam characterization system in accordance with several example aspects of the present disclosure.

The present disclosure appreciates that the ion beam characterization system 100 of FIG. 1 and/or the ion beam characterization system 160 of FIG. 2 can be advantageously incorporated into a semiconductor processing system, such as an ion implantation system. Thus, in accordance with one aspect of the present disclosure, FIG. 3 illustrates an exemplary semiconductor processing system 200 in which various aspects of the present may be practiced. The semiconductor processing system 200 in the present example comprises an ion implantation system 202, however various other types of semiconductor processing systems or vacuum systems are also contemplated, such as plasma processing systems, or other processing systems. The ion implantation system 202, for example, comprises a terminal 204, a beamline assembly 206, and an end station 208. Generally speaking, an ion source 210 in the terminal 204 is coupled to a power supply 212 to ionize a dopant gas into a plurality of ions and to form an ion beam 214. The ion beam 214 in the present example is directed through a beam-steering apparatus 216, and out an aperture 218 towards the end station 208. In the end station 208, the ion beam 214 bombards a workpiece 220 (e.g., a semiconductor such as a silicon wafer, a display panel, etc.), which is selectively clamped or mounted to an electrostatic clamp 222 (ESC). Once embedded into the lattice of the workpiece 220, the implanted ions change the physical and/or chemical properties of the workpiece. Because of this, ion implantation is used in semiconductor device fabrication and in metal finishing, as well as various applications in materials science research.

The ion implantation system 202, for example, can further comprise an ion beam characterization system 224, such as the ion beam characterization system 100 of FIG. 1 or the ion beam characterization system 160 of FIG. 2. A controller 226 of FIG. 3, for example, can be configured for selective control of the semiconductor processing system 200, including the ion beam characterization system 224.

The present disclosure contemplates the ion beam characterization system 224 as comprising a tomography system using a plurality of measurements along a plurality of various projections through a sample in order to construct a two-dimensional image of the object under consideration, such as the ion beam 214. As such, a real time, non-invasive two-dimensional profile of the ion beam 214 can be advantageously utilized in tuning of the ion implantation system 202. For example, signals generated within an object, such as light from plasma generated by ions in the ion beam 214, can be measured to determine various features of the ion beam.

The present disclosure, in one example, utilizes an algebraic approach to characterize a portion of the full ion beam. It is noted that while an algebraic approach is described herein, the present disclosure also appreciates various other techniques for characterizing the ion beam as falling within the scope of the present disclosure.

In the present example, a portion of the ion beam 214 is defined as a characterization region 228 (e.g., the region of interest 110 of FIGS. 1-2), wherein the characterization region is divided into a predetermined number m of cells or pixels. As discussed above, a plurality of profiling positions are provided, whereby for each profiling position, a contribution (e.g., a measurement vector) from each cell is calculated to define a weight associated with each cell. Each measurement vector can be further projected onto an m-dimensional hyperplane, whereby the process of measurement and calculation is iterated to define a solution.

The present disclosure appreciates that the signals 185 received from the plurality of sensors 170A-170G of FIG. 2, for example, may not be directly proportional to ion density. Rather, the signals 185 may be associated with light generated by action of the ion beam 110 on a gas (e.g., nitrogen) provided by a gas source 230 of FIG. 3. Thus, the present disclosure contemplates one or more flow rates (e.g., 10 sccm or less) and/or species of the gas that is flowed from the gas source 230 into the characterization region 228, such as associated with the end station 208 of the ion implantation system 202 of FIG. 3.

Alternatively, the present disclosure contemplates a background gas, albeit in small quantities, being present in most vacuum systems such as the ion implantation system 202, whereby the background gas is sufficient for the characterization described herein. The present disclosure, for example, further contemplates no gas being flowed to the characterization region 228. It is noted that in the present example, the characterization region 228 is associated with the end station 208 of FIG. 3; however, that the present disclosure contemplates the characterization region being at any location of the ion implantation system 202 where characterization of the ion beam 214 is desired.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion beam characterization system comprising:

one or more sensors positioned with respect to an ion beam, wherein the one or more sensors are configured to image a portion of the ion beam over a predetermined range of angles and positions of the one or more sensors with respect to the portion of the ion beam, thereby defining imaging data associated with the portion of the ion beam;

an aperture apparatus selectively positioned between the one or more sensors and the ion beam, wherein the aperture apparatus comprises one or more apertures configured to control an amount of the light associated with the ion beam received by the one or more sensors;

a transformation motion apparatus associated with the one or more sensors, wherein the transformation motion apparatus is configured to selectively control the light received by the one or more sensors; and a controller configured to define a two-dimensional profile of the portion of the ion beam based, at least in part, on the imaging data, wherein the controller is configured to compute the two-dimensional profile of the portion of the ion beam based, at least in part, on the predetermined range of angles and positions of the one or more sensors with respect to the ion beam and the light associated with the ion beam, wherein the one or more sensors are configured to receive the light associated with the ion beam and to provide a signal to the controller based on the light that is received by the one or more sensors.

2. The ion beam characterization system of claim 1, wherein the transformation motion apparatus is operably coupled to the one or more sensors and configured to selectively move the one or more sensors in one or more directions with respect to the ion beam.

3. The ion beam characterization system of claim 2, wherein the transformation motion apparatus comprises a translation apparatus configured to selectively translate the one or more sensors with respect to the ion beam.

4. The ion beam characterization system of claim 2, wherein the transformation motion apparatus comprises a rotation apparatus configured to selectively rotate the one or more sensors with respect to the ion beam.

5. The ion beam characterization system of claim 1, wherein the transformation motion apparatus is configured to selectively move the aperture apparatus in one or more directions with respect to the ion beam, and wherein the controller is further configured to compute the two-dimensional profile of the portion of the ion beam based, at least in part, on a position of the one or more apertures with respect to the ion beam.

6. The ion beam characterization system of claim 5, wherein the transformation motion apparatus comprises a translation apparatus configured to selectively translate the aperture apparatus with respect to the ion beam.

7. The ion beam characterization system of claim 1, wherein the transformation motion apparatus comprises a rotation apparatus configured to selectively rotate the aperture apparatus with respect to the ion beam.

8. The ion beam characterization system of claim 1, wherein the one or more apertures consist of a plurality of apertures positioned at a respective plurality of angles with respect to the ion beam.

9. The ion beam characterization system of claim 1, further comprising a gas source configured to supply a gas to a region associated with the portion of the ion beam.

10. The ion beam characterization system of claim 9, wherein the ion beam is configured to form a plasma with the gas, wherein the light associated with the ion beam is associated with light emitted from the plasma.

11. The ion beam characterization system of claim 1, wherein the controller and the one or more sensors generally define a tomographic system.

12. The ion beam characterization system of claim 1, wherein the two-dimensional profile is defined by a matrix of pixels.

13. The ion beam characterization system of claim 12, wherein the matrix of pixels is associated with the portion of the ion beam.

14. An ion beam characterization system comprising:

a plurality of sensors positioned with respect to an ion beam and configured to receive light associated with a portion of the ion beam, wherein the plurality of sensors are configured to define imaging data based on the light that is received by the plurality of sensors over a predetermined range of angles and positions of the plurality of sensors with respect to the portion of the ion beam;

a transformation motion apparatus associated with the plurality of sensors, wherein the transformation motion apparatus is configured to selectively control the light received by the plurality of sensors;

an aperture apparatus selectively positioned between the plurality of sensors and the ion beam, wherein the aperture apparatus comprises one or more apertures configured to control an amount of the light received by the plurality of sensors, wherein the transformation motion apparatus is configured to selectively move the aperture apparatus in one or more directions with respect to the ion beam; and a controller configured to receive the imaging data and to define a two-dimensional profile of the portion of the ion beam based, at least in part, on the imaging data, and wherein the controller is further configured to compute the two-dimensional profile of the portion of the ion beam based, at least in part, on a position of the one or more apertures with respect to the ion beam.

15. The ion beam characterization system of claim 14, wherein the two-dimensional profile is defined by a matrix of pixels associated with the portion of the ion beam.

16. The ion beam characterization system of claim 14, wherein the transformation motion apparatus is operably coupled to the plurality of sensors and configured to selectively move the plurality of sensors in one or more directions with respect to the ion beam.

17. The ion beam characterization system of claim 16, wherein the transformation motion apparatus comprises one or more of a translation apparatus configured to selectively translate the plurality of sensors with respect to the ion beam and a rotation apparatus configured to selectively rotate the plurality of sensors with respect to the ion beam.

18. The ion beam characterization system of claim 14, wherein the one or more apertures consist of a plurality of apertures positioned at a respective plurality of angles with respect to the ion beam.

19. The ion beam characterization system of claim 14, further comprising a gas source configured to supply a gas to a region associated with the portion of the ion beam, wherein the ion beam is configured to form a plasma with the gas, and wherein the light associated with the ion beam is associated with light emitted from the plasma.

20. The ion beam characterization system of claim 14, wherein the controller and the plurality of sensors generally define a tomographic system.

* * * * *